United States Patent
Su

(10) Patent No.: US 7,779,314 B2
(45) Date of Patent: Aug. 17, 2010

(54) SYSTEM AND RELATED METHOD FOR CHIP I/O TEST

(75) Inventor: Chun-Yuan Su, Taipei Hsien (TW)

(73) Assignee: VIA Technologies Inc., Hsin-Tien, Taipei Hsien (TW)

(*) Notice: Subject to any disclaimer, the term of this patent is extended or adjusted under 35 U.S.C. 154(b) by 874 days.

(21) Appl. No.: 11/616,001

(22) Filed: Dec. 25, 2006

(65) Prior Publication Data

US 2008/0115022 A1 May 15, 2008

(30) Foreign Application Priority Data

Oct. 19, 2006 (TW) .............................. 95138604 A

(51) Int. Cl.
*G11C 29/00* (2006.01)
*G01R 31/28* (2006.01)
*G01R 31/26* (2006.01)

(52) U.S. Cl. .................... 714/718; 714/724; 365/201; 324/765

(58) Field of Classification Search ........................ None
See application file for complete search history.

(56) References Cited

U.S. PATENT DOCUMENTS

| 7,143,312 B1* | 11/2006 | Wang et al. ............... 714/30 |
| 7,279,810 B2* | 10/2007 | Nitta ............................ 307/64 |
| 7,475,316 B2* | 1/2009 | Cowell et al. ............. 714/734 |
| 2002/0030531 A1 | 3/2002 | Jaynes |
| 2004/0049721 A1 | 3/2004 | Laake |
| 2006/0107186 A1* | 5/2006 | Cowell et al. ............. 714/776 |

FOREIGN PATENT DOCUMENTS

TW        564309      12/2003
TW     200624843      7/2006

* cited by examiner

*Primary Examiner*—Kevin L Ellis
*Assistant Examiner*—Guerrier Merant
(74) *Attorney, Agent, or Firm*—Winston Hsu

(57) ABSTRACT

System and related method for testing a chip with a high-speed bus interface in a low speed testing environment is provided. The testing method for testing input/output functions of a chip includes: establishing an inner loop path between a transmission mechanism and a receiving mechanism of the chip; transmitting a testing data; and receive the testing data via the inner loop path.

15 Claims, 4 Drawing Sheets

SYSTEM AND RELATED METHOD FOR CHIP I/O TEST

FIELD OF THE INVENTION

The disclosure relates to a system and related method for testing chips, and, more particularly, is related to a system for testing high speed chip and a method thereof.

BACKGROUND OF THE INVENTION

In computer system, data is transacted between devices via the buses. For instance, in a computer system, a central processing unit (CPU) bridges a number of peripherals, such as hard disk drivers, compact disc (CD) drivers, display cards and etc, through a chipset, and the connections between the CPU, the chipset, and the peripherals are via the buses for transferring data. Regarding to the requirements of efficiency and utility rate, the computer system with high performance is designed. Therefore, the bus speed is raised to meet the requirements of transacting data quickly. As a result, in modern computer system, a high speed bus, for example the Hyper-Transport Bus, is used between CPU and the chipset. According to the HT bus specification, the data is transmitted at the high speed of 2 GHz under the 1 GHz clock cycles.

In order to ensure the correct operations of the electronic devices, the input/output functions are tested when manufacturing the electronic device. When testing the electronic device, an external testing device is introduced in one end of the electronic device; therefore a testing data is transmitted from the testing device to the electronic device and then the testing data is received in another end of the electronic device. Finally, the transmitted testing data and the received testing data is compared to determined whether the electronic device is correctly operated. Since the high speed bus is required in the modern electronic devices, the high speed testing device for testing high speed input/out functions is required. However, the high speed testing device is pretty expansive, the cost of the electronic device is increased.

Therefore, it has become an important issue to provide a system and related method for testing an electronic device with a high-speed bus interface.

SUMMARY OF THE INVENTION

In view of the foregoing, the invention is to provide a system and related method for testing a chip with a high-speed bus interface in a low-cost testing environment.

A testing system is provided in the present invention for testing input/output functions of a chip, wherein the chip is connected to a high speed bus and a low speed bus. The system includes: a core circuit mastering the encoding/decoding operations of data; and a high-speed bus interface circuit connected between the core circuit and the high speed bus having a transmission mechanism for transmitting data to the high speed bus; and a receiving mechanism for receiving data from the high speed bus; wherein when testing the chip, an inner loop path in the high-speed bus interface circuit is established, and the transmission mechanism transmits a testing data to the receiving mechanism via the inner loop path.

A testing method is also provided in the present invention for testing input/output functions of a chip, wherein the chip is connected to a high speed bus and a low speed bus. The method includes: establishing an inner loop path between a transmission mechanism and a receiving mechanism of the chip; transmitting a testing data; and receive the testing data via the inner loop path; wherein the testing data is transmitted by the transmission mechanism and received by the receiving mechanism.

An operation method of a chip is also provided in the present invention, wherein the chip is connected to a high speed bus. The method includes: establishing an inner loop path between a transmission mechanism and a receiving mechanism of the chip; receiving a testing data via the inner look path while testing the chip; and transmitting data to the high speed bus and receiving data from the high speed bus while normal operating the chip; wherein the testing data and the data is transmitted by the transmission mechanism and received by the receiving mechanism.

The various objects and advantages of the present invention will be more readily understood from the following detailed description when read in conjunction with the appended drawing, in which:

DETAILED DESCRIPTION

The system and related method for chip test according to the embodiments of the invention will be apparent from the following detailed description, which proceeds with reference to the accompanying drawings, wherein the same references relate to the same elements.

Figure 1:
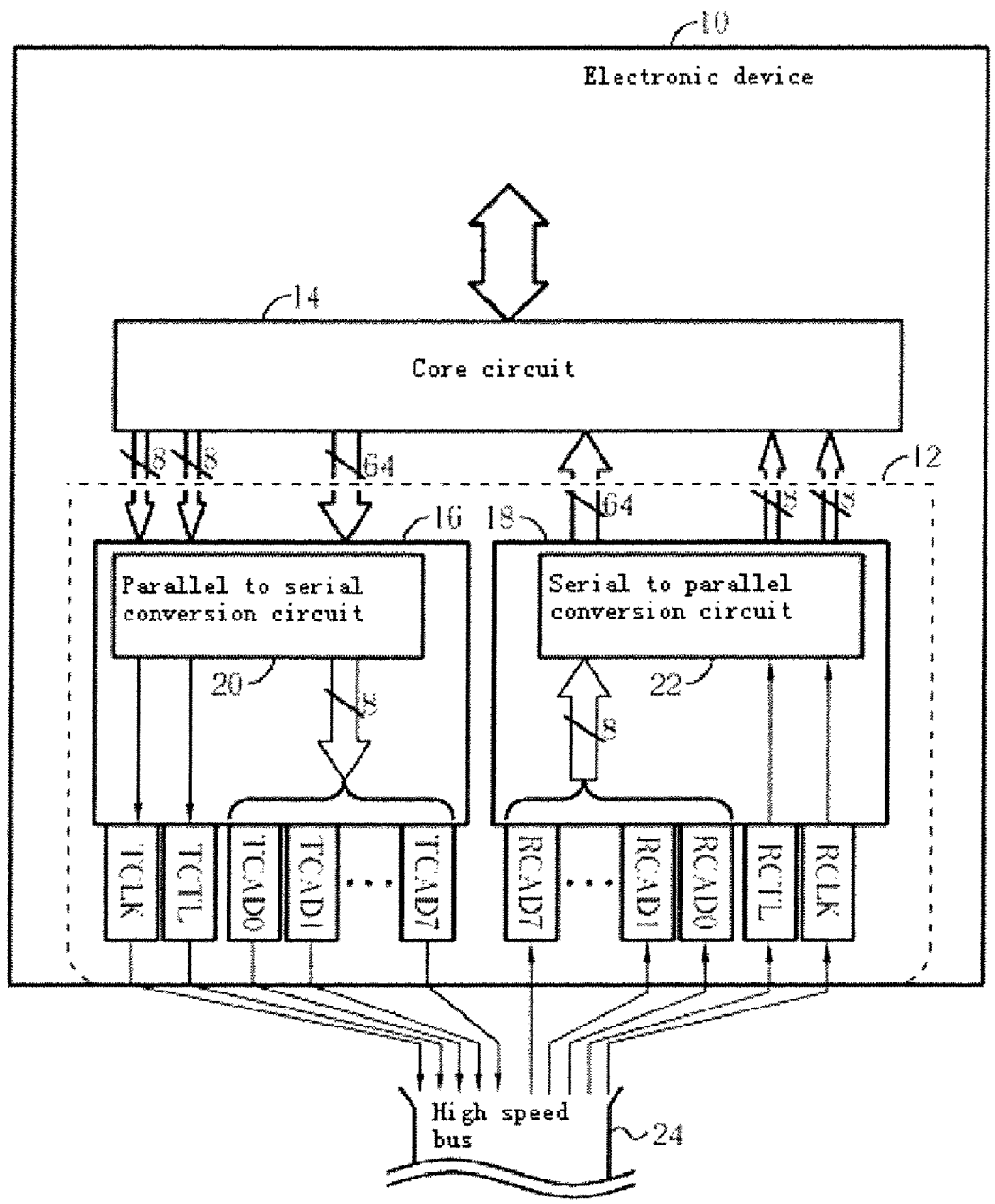
FIG. 1 is a schematic diagram of an electronic device with a high-speed bus interface circuit.

As show in FIG. 1, a schematic diagram of an electronic device 10. The electronic device 10 includes a high-speed bus interface circuit 12 and a core circuit 14. Herein, the electronic device 10 could be a chip, such as a chipset in a computer system; and the electronic device 10 transacts data with other electronic devices (not show in FIG. 1) through a high speed bus 24 connected to the high-speed bus interface circuit 12. In the invention, assume the high speed bus 24 is Hyper-Transport Bus (i.e. HT bus). The core circuit 14 masters the encoding/decoding operations and controls bus accesses (i.e. whether to give a response or the response timing when receiving an access request from the bus.) The high-speed bus interface circuit 12 includes a transmission circuit 16, a receiving circuit 18, and IO pads such as TCLK, TCTL, TCAD0-TCAD7, RCLK, RCTL, RCAD0-RCAD7 for transmitting and receiving data to or from the high-speed bus 24. The IO pads are respectively connected to the high-speed bus 24 for transmitting or receiving signal in the special form defined by the bus specification. The transmission circuit 16 and the receiving circuit 18 realize the signal transmission and receiving functions of the physical layer, respectively.

When a transmitted data is transferred from the electronic device 10 to the high-speed bus 24, the data is encoded by the core circuit 14, and converted to the acceptable signal form of the high-speed bus 24 by the transmission circuit 16; then the data is delivered to the high-speed bus 24 by the IO pads TCLK, TCTL and TCAD0-TCAD7.

As show in FIG. 1, the core circuit 14 encodes and converts the transmitted data into the data signal with 64 bits-250 MHz. The data signal with 64 bits-250 MHz is transferred to the transmission circuit 16 by a control signal with 8 bits-250 MHz and a clock signal with 8 bits-250 MHz. The parallel to serial conversion circuit 20 of the transmission circuit 16 converts the data signal with 64 bits-250 MHz into the data signal with 8 bits-2 GHz. Moreover, the parallel to serial conversion circuit 20 also converts the control signal with 8 bits-250 MHz and the clock signal with 8 bits-250 MHz into the control signal with 1 bit-2 GHz and the clock signal with 1 bit-1 GHz, respectively. Therefore, the control signal with 1 bit-2 GHz and the clock signal with 1 bit-1 GHz are transmitted to the high-speed bus 24 via the IO pads TCTL and TCLK, respectively. Meanwhile, the data signal with 8 bits-2 GHz is transmitted to the high-speed bus 24 by the IO pads TCAD0-TCAD7, respectively.

When a received data is transferred from the high-speed bus 24 to the electronic device 10, the received data in the form of data signal with 8 bits-2 GHz data is transferred to the electronic device 10 by a control signal with 1 bit-2 GHz and a clock signal with 1 bit-1 GHz via the high-speed bus 24. The IO pads TCLK, TCTL and TCAD0-TCAD7 of the high-speed bus interface circuit 12 respectively receive the control signal with 1 bit-2 GHz, the clock signal with 1 bit-1 GHz and the data signal with 8 bits-2 GHz. Then the serial to parallel conversion circuit 22 of the receiving circuit 18 converts the control signal with 1 bit-2 GHz and the clock signal with 1 bit-1 GHz into the control signal with 8 bits-250 MHz and the clock signal with 8 bits-250 MHz, respectively. Moreover, the serial to parallel conversion circuit 22 also converts the data signal with 8 bits-2 GHz into the data signal with 64 bits-250 MHz. The data signal, the control signal and the clock signal are decoded by the core circuit 14; therefore the electronic device 10 could receive the data transferred from the other electronic devices via the high-speed bus 24.

To ensure the operations of the electronic device 10 are correct, it is necessary to test the input/output functions of the electronic device 10 to see whether the data is correctly transmitted and received and respects to the high-speed bus specification.

When testing the high speed input/output functions of the electronic device 10, a high speed testing device is externally connected to the IO pads TCLK, TCTL, TCAD0-TCAD7, RCLK, RCTL, RCAD0-RCAD7 of the high-speed bus interface circuit 12 for transmitting and receiving high speed test signals. However, the cost of testing is pretty high due to the high prices of the external high speed testing device; as a result, the cost of the electronic device 10 is increased.

The present invention provides a system and related method for testing an electronic device with a high-speed bus interface in a low-speed testing environment.

Figure 2:
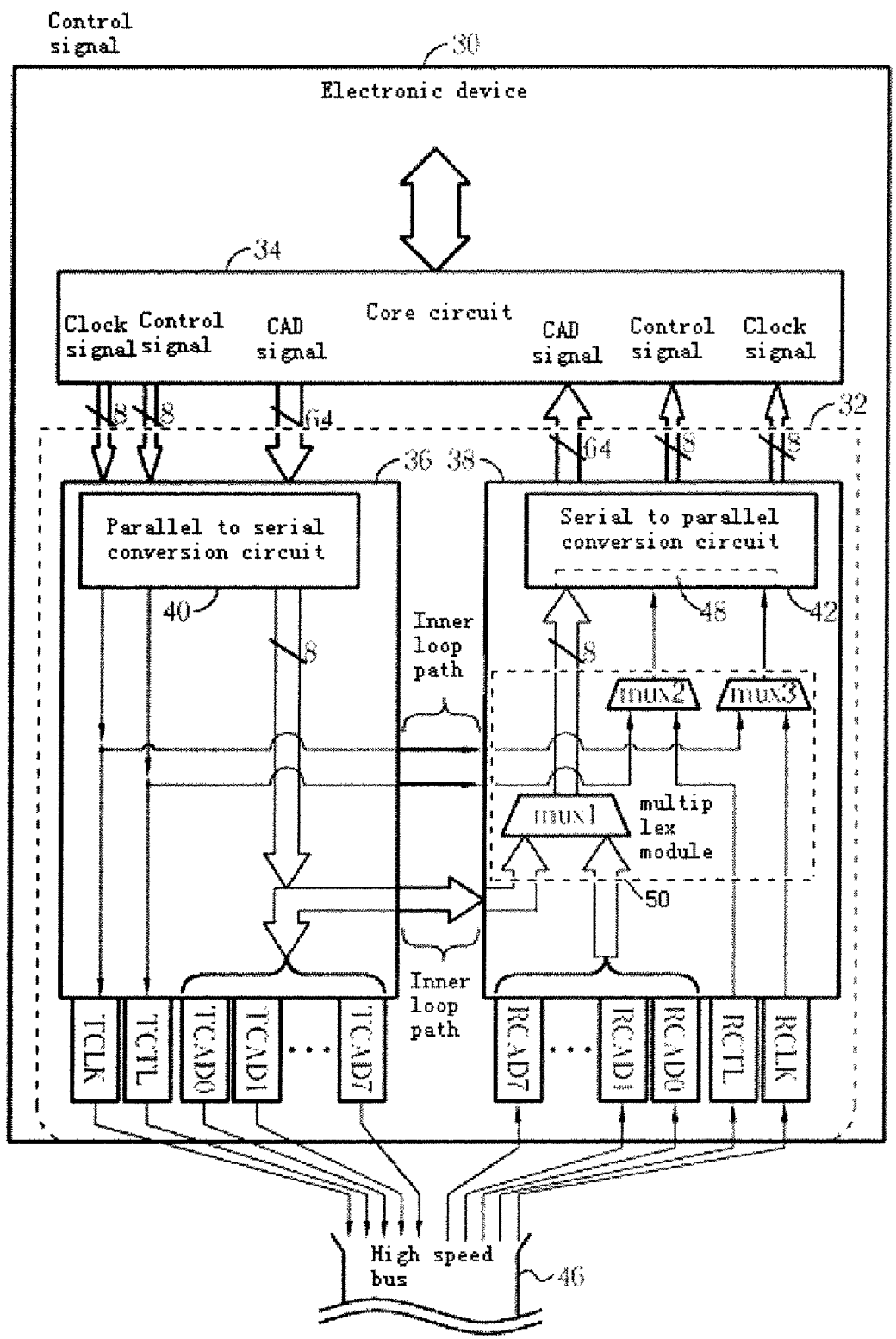
FIG. 2 is a schematic diagram of an electronic device with a high-speed bus interface circuit according to an embodiment of the present invention.

FIG. 2 is a schematic diagram of an electronic device 30 with a high-speed bus interface circuit according to a first embodiment of the present invention. The electronic device 30 could be a chip in an electronic system, such as a chipset in a computer system. The electronic device 30 includes a high-speed bus interface circuit 32 and a core circuit 34. The electronic device 30 transacts data with other electronic devices (not show in FIG. 2) through a high speed bus 46 connected to the high-speed bus interface circuit 32. In the present invention, assume the high speed bus 46 is a Hyper-Transport Bus (i.e. HT bus) for transferring data between CPU and chipset (not show in FIG. 2). The core circuit 34 masters the encoding/decoding operations and controls bus accesses.

The high-speed bus interface circuit 32 includes a transmission circuit 36 and a receiving circuit 38, and IO pads TCLK, TCTL, TCAD0-TCAD7, RCLK, RCTL, RCAD0-RCAD7 for transmitting and receiving data to or from the high-speed bus 46. The transmission circuit 36 and the receiving circuit 38 realize the signal transmission and receiving functions of the physic layer, respectively.

Please refer to FIG. 2, in the present invention assume the high-speed bus interface circuit 32 is a HT bus interface circuit; therefore, the core circuit 34 provides a corresponding command address data (CAD) signal with 64 bits-250 MHz with respect to the HT bus specification. In conjunction with a control signal with 8 bits-250 MHz and a clock signal with 8 bits-250 MHz, the CAD signal with 64 bits-250 MHz is transferred. Then the parallel to serial conversion circuit 40 of the transmission circuit 36 converts the CAD signal with 64 bits-250 MHz into the CAD signal with 8 bits-2 GHz; moreover, the parallel to serial conversion circuit 40 also coverts the control signal with 8 bits-250 MHz and the clock signal with 8 bits-250 MHz into the control signal with 1 bit 2 GHz and the clock signal with 1 bit 1 GHz, respectively.

The serial to parallel conversion circuit 42 of the receiving circuit 38 receives the CAD signal with 8 bits-2 GHz, the control signal with 1 bit-2 GHz and the clock signal with 1 bit-1 GHz via a receiving port 48; and the converts the signals into the CAD signal with 64 bits-250 MHz, the control signal with 8 bits-250 MHz and the clock signal with 8 bits-250 MHz, respectively. Then, the converted signals are transferred and decoded by the core circuit 34.

In the present invention, the IO pads TCLK, TCTL, TCAD0-TCAD7, RCLK, RCTL, RCAD0-RCAD7 are respectively connected to the high speed bus 46 for transmitting or receiving signals defined by the high speed bus specification (i.e. HT bus specification).

According to the present invention, when testing the input/output functions of the electronic device 30, an inner loop path is established between the transmission circuit 36 and the receiving circuit 38 of the high-speed bus interface circuit 32. As a result, the testing signals transmitted by the transmission circuit 36 are received by the receiving circuit 38 via the inner loop path. In addition, the receiving circuit 38 has a multiplex module 50 for selecting the signals transmitted to the high-speed bus interface circuit 32 from either the high-speed bus 46 or from the inner loop path.

The testing data transmitted by the transmission circuit 36 includes the clock signal CLK, the control signal CMD and the command address data signal CAD; therefore the three signals CLK, CMD and CAD are transmitted to the receiving circuit 38 via the inner loop path. The multiplex module 50 of the receiving circuit 38 includes three multiplexers, MUX1, MUX2 and MUX3, for selecting either the testing data from the transmission circuit 36 or the transmitted data from the high speed bus 46 is transmitted to the receiving circuit 38. Furthermore, in the present invention, the multiplexer MUX1 selects the CAD signal from the transmission circuit 36 or from the IO pads RCAD0~RCAD7; the multiplexer MUX2 selects the control signal CMD from the transmission circuit 36 or from the IO pad RCTL; and the multiplexer MUX3 selects the clock signal CLK from the transmission circuit 36 or from the IO pad RCLK.

When testing, the testing data (including the clock signal CLK, control signal CMD and command address data signal CAD) transmitted by the transmission circuit 36 is selected and transferred to the receiving circuit 38 via the inner loop path. By the comparisons of the transmitted testing data transmitted and the received testing data, the input/output functions of the electronic device 30 can be identified.

When the high-speed bus interface circuit 32 is normally operated, the multiplex module 50 ends the inner loop path. Therefore, the receiving circuit 38 receives data from the high speed bus 46 via the input IO pads RCLK, RCTL and RCAD0-RCAD7. On the contrary, the transmission circuit 36 transmits data to the high speed bus 46 via the output IO pads TCLK, TCTL and TCAD0-TCAD7.

As the described above, the inner loop path is established when testing input/output functions of the electronic device 30 without connecting an external high speed testing device to the electronic device 30.

For example, with respect to the HT bus specification, the frequency of the clock signal CLK is 1 GHz and the frequency of the control signal is 2 GHz; however, the high-speed bus interface circuit 32 is triggered at the frequency of 100 MHz. After the high-speed bus interface circuit 32 is triggered, the core circuit 34 transacts data with the transmission circuit 36 and receiving circuit 38 at the frequency of 250 MHz (the CAD signal with 64 bits-250 MHz, the control signal with 8 bits-250 MHz and the clock signal with 8 bits-250 MHz). Moreover, the transmission circuit 36 and receiving circuit 38 respectively transmits and receives data to and from the high-speed bus 46 at the frequency of 1 GHz (i.e. clock signal) or 2 GHz (i.e. control signal and CAD signal).

In the embodiment, the testing is accomplished at 100 MHz; therefore, testing the input/output functions of an electronic device with high speed interface at low frequency testing environment is achieved.

In addition, the input/output functions testing could be further achieved at lower speed In a computer system, the high speed CPU and the low speed peripherals are respectively connected to the chipset via the high speed bus (ex. HT bus) and the low speed bus. The low speed bus, for example, a Peripheral Communication Interconnect (PCI) is operated at 33 MHz. In the invention, the testing data could be inputted from the low speed bus (PCI bus).

Figure 3:
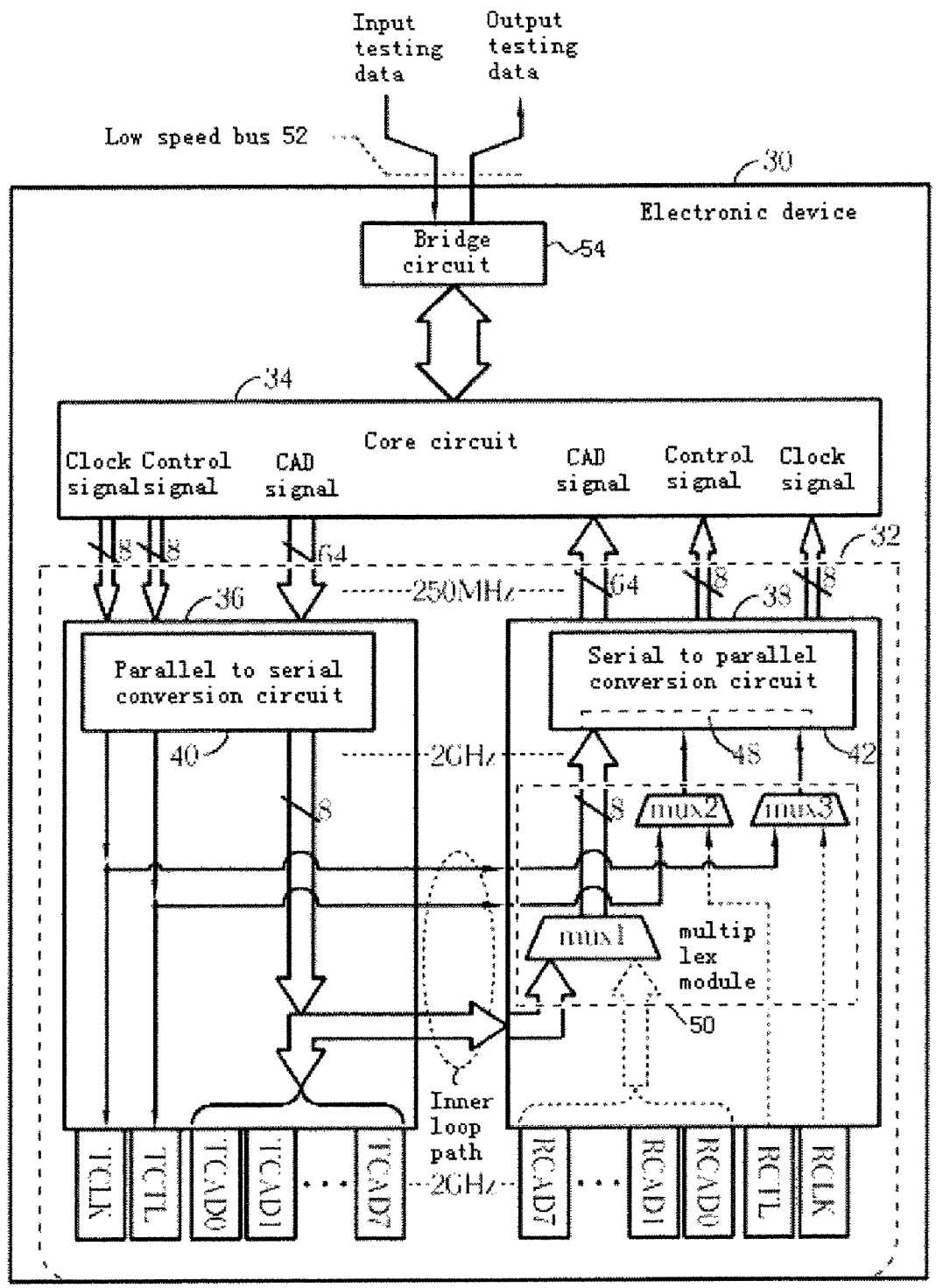
FIG. 3 is a schematic diagram illustrating testing the electronic device with a high-speed bus interface circuit via a low-speed bus according to the present invention.

FIG. 3 is a schematic diagram of testing input/output functions of the electronic device 30 with a high-speed bus interface circuit via a low speed bus according to the second embodiment of the present invention. Assume that a low speed bus 52 is a PCI bus (i.e. 33 MHz) and connected to the electronic device 30. In the present invention, the testing data is inputted to the high speed interface circuit 32 from the low speed bus 52 via a bridge circuit 54 for testing input/output functions of the electron device 30. The testing method of the second embodiment is similar as the above and is not detail described here.

In the embodiment, the testing is accomplished at 33 MHz; therefore, testing the input/output functions of a electronic device with high speed interface at low frequency testing environment is achieved.

Although the electronic device 30 is tested at low frequency testing environment, the high-speed bus interface circuit 32 still operates at normal high speed. As shown in FIG. 2 and FIG. 3, the high speed input/output functions (ex. (2 GHz) for HT bus) of the electronic device 30 is tested at either 100 MHz or 33 MHz; however, the transmission circuit 36 and receiving circuit 38 of the high-speed bus interface circuit 32 still transact data with 2 GHz.

Because the testing is implemented by establishing an inner loop path in the electron device, the signals are more correctly align than testing the electronic device 30 through an external testing device.

Figure 4:
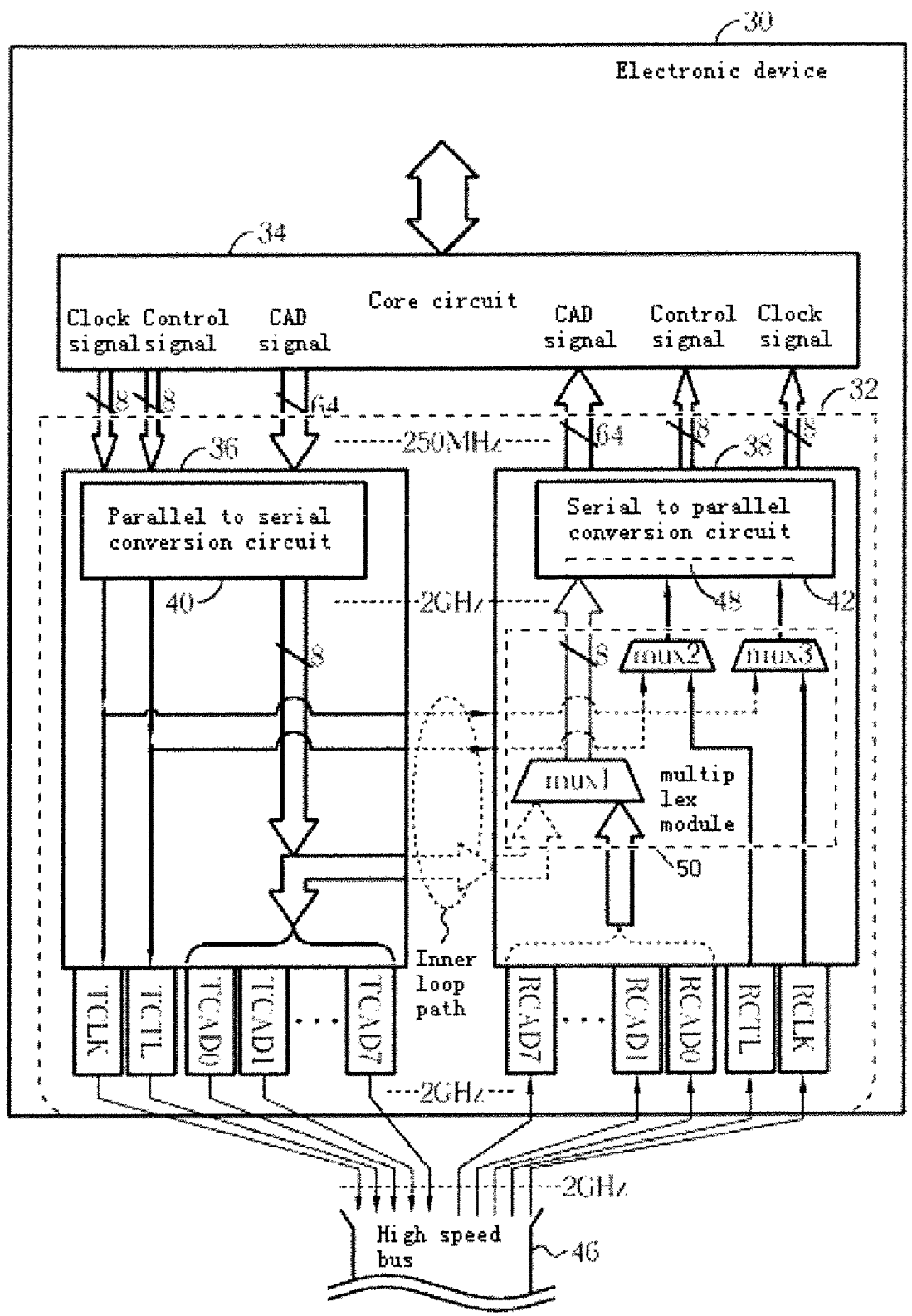
FIG. 4 is a schematic diagram illustrating the electronic device in normally operation state according to the present invention.

FIG. 4 is a schematic diagram illustrating the electronic device 30 normally operated according to the third embodiment of the present invention. As show in FIG. 4, when normal operating, the inner loop path is disconnected (broken line show in FIG. 4); therefore, the transmission circuit 36 normally transmit the clock signal, the control signal and the CAD signal to the high-speed bus 46 via the output IO pads TCLK, TCTL, TCAD0-TCAD7, respectively; and the receiving circuit 38 normally receives the clock signal, the control signal and the CAD signal from the high-speed bus 46 via the input IO pads RCLK, RCTL, RCAD0-RCAD7, respectively.

In summary, the present invention provides a system and method for testing a electronic device with high speed interface by establishing an inner loop path in the electronic device. Therefore, an external testing device is not needed and the testing cost is decreased. The high-speed bus interface circuit in FIG. 2 to FIG. 5 is based on the 8 bits HT bus specification, but it is not limited. The present invention can be applied to the other high speed bus with different bandwidth.

Although the present invention has been described with reference to specific embodiments thereof, it will be understood that the invention is not limited to the details thereof. Various substitutions and modifications have suggested in the foregoing description, and other will occur to those of ordinary skill in the art. Therefore, all such substitutions and modifications intended to be embraced within the scope of the invention as defined in the appended claims.

The invention claimed is:

1. A system for transmitting test data in a chip, wherein the chip is connected to a high speed bus and a low speed bus, comprising:
   a core circuit mastering the encoding/decoding operations of data; and
   a high-speed bus interface circuit connected between the core circuit and the high speed bus comprising:
   a transmission circuit connected to the core circuit for implementing a transmission mechanism of the high-speed bus interface circuit; and
   a receiving circuit connected to the core circuit for implementing a receiving mechanism of the high-speed bus interface circuit;
   wherein when transmitting the test data in the chip:
   an inner loop path in the high-speed bus interface circuit is established, and the transmission mechanism transmits the testing data to the receiving mechanism via the inner loop path;
   a multiplex module selects the testing signal from the transmission circuit to be transmitted to the receiving circuit via the inner loop path; when normal operating the chip, the multiplex module selects data from the high-speed bus to be received by the receiving circuit;
   wherein the data comprises a command address data (CAD) signal, a control signal and a clock signal;
   and the multiplex module comprises a first multiplexer for selecting the CAD signal; a second multiplexer for selecting the control signal; and a third multiplexer for selecting the clock signal.

2. The system according to claim 1, wherein the transmission circuit comprises a parallel to serial conversion circuit for converting the data with respect to the high speed bus specification.

3. The system according to claim 2 wherein the high speed bus is Hyper-Transport Bus, and the parallel to serial conversion circuit converts a CAD signal with 64 bits-250 MHz, a control signal with 8 bits-250 MHz and a clock signal with 8 bits-250 MHz into the CAD signal with 8 bits-2 GHz, the control signal with 1 bit-2 GHz and the clock signal with 1 bit-1 GHz, respectively.

4. The system according to claim 1 wherein the receiving circuit comprises a serial to parallel conversion circuit for converting data with respect to the high speed bus specification.

5. The system according to claim 4 wherein the high speed bus is Hyper-Transport Bus, and the serial to parallel conversion circuit converts a CAD signal with 8 bits-2 GHz, a control signal with 1 bit-2 GHz and a clock signal with 8 bits-250 MHz into the CAD signal with 1 bit-1 GHz, the control signal with 8 bits-250 MHz and the clock signal with 64 bits-250 MHz, respectively.

6. The system according to claim 1 further comprising a bridge circuit connected between the core circuit and the low speed bus, wherein the testing data is inputted from the low speed bus.

7. The system according to claim 1 further comprising a plurality of IO pads connected between the high-speed bus interface circuit and the high speed bus.

8. A testing method for testing input/output functions of a chip, wherein the chip is connected to a high speed bus and a low speed bus, comprising:
    establishing an inner loop path between a transmission mechanism and a receiving mechanism of the chip;
    selecting a test data from the transmission mechanism by a multiplex module,
    wherein the test data comprises a command address data (CAD) signal, a control signal and a clock signal;
    transmitting the selected test data;
    receiving the test data via the inner loop path; and
    comparing the selected test data with the test data received via the inner loop path;
    wherein the test data is transmitted by the transmission mechanism and received by the receiving mechanism, and
    wherein the multiplex module comprises:
    a first multiplexer for selecting the CAD signal;
    a second multiplexer for selecting the control signal;
    and a third multiplexer for selecting the clock signal.

9. The testing method according to claim 8 wherein the transmission mechanism converts the CAD signal with 64 bits-250 MHz, the control signal with 8 bits-250 MHz and the clock signal with 8 bits-250 MHz into the CAD signal with 8 bits-2 GHz, the control signal with 1 bit-2 GHz and the clock signal with 1 bit-1 GHz, respectively.

10. The testing method according to claim 9 wherein the receiving mechanism converts the CAD signal with 8 bits-2 GHz, the control signal with 1 bit-2 GHz and the clock signal with 1 bit-1 GHz into the CAD signal with 64 bits-250 MHz, the control signal with 8 bits-250 MHz and the clock signal with 8 bits-250 MHz, respectively.

11. The testing method according to claim 8 wherein the testing signal is transmitted and received in the low speed bus.

12. The testing method according to claim 8 wherein the high speed bus is Hyper-Transport Bus.

13. The testing method according to claim 8 wherein the low speed bus is Peripheral Communication Interconnect Bus.

14. An operation method of a chip, wherein the chip is connected to a high speed bus, comprising:
    establishing an inner loop path between a transmission mechanism and a receiving mechanism of the chip;
    determining a test data from the transmission mechanism by a multiplex module, wherein the test data comprises a command address data (CAD) signal, a control signal and a clock signal;
    receiving the test data via the inner loop path while testing the chip; and
    transmitting data to the high speed bus and receiving data from the high speed bus while normal operating the chip;
    wherein the testing data and the data are transmitted by the transmission mechanism and received by the receiving mechanism, and
    wherein the multiplex module comprises:
    a first multiplexer for selecting the CAD signal;
    a second multiplexer for selecting the control signal; and a third multiplexer for selecting the clock signal.

15. The chip operation method according to claim 14, wherein the high speed bus is Hyper-Transport Bus.

* * * * *